(12) United States Patent
Huang et al.

(10) Patent No.: US 6,914,842 B2
(45) Date of Patent: Jul. 5, 2005

(54) PURE CMOS LATCH-TYPE FUSE CIRCUIT

(75) Inventors: Chong-Jen Huang, Taipei (TW);
Yu-Ming Hsu, Hsin-Chu (TW);
Jie-Hau Huang, Tai-Chung Hsien (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/610,529

(22) Filed: Jul. 2, 2003

(65) Prior Publication Data

US 2005/0002262 A1 Jan. 6, 2005

(51) Int. Cl.[7] ................................................. G11C 7/10
(52) U.S. Cl. .............................. 365/225.7; 365/185.29; 365/185.14
(58) Field of Search ....................... 365/225.7, 185.29, 365/185.01, 185.05, 185.1, 185.14, 96, 189.05, 154, 230.08, 104

(56) References Cited

U.S. PATENT DOCUMENTS

| | | | | |
|---|---|---|---|---|
| 5,566,107 A | * | 10/1996 | Gilliam | 365/200 |
| 6,363,011 B1 | * | 3/2002 | Hirose et al. | 365/185.07 |
| 6,400,632 B1 | * | 6/2002 | Tanizaki et al. | 365/225.7 |
| 2002/0027822 A1 | * | 3/2002 | Candelier et al. | 365/225.7 |
| 2002/0060934 A1 | * | 5/2002 | Choi et al. | 365/200 |
| 2002/0176286 A1 | * | 11/2002 | Bergemont et al. | 365/200 |
| 2004/0066670 A1 | * | 4/2004 | DeShazo et al. | 365/185.28 |

* cited by examiner

*Primary Examiner*—Van Thu Nguyen
*Assistant Examiner*—Dang T Nguyen
(74) *Attorney, Agent, or Firm*—Winston Hsu (57) ABSTRACT

An option fuse circuit, which can be viewed as a latch-type option fuse circuit, is manufactured with a standard single-poly CMOS manufacturing process. The option fuse circuit includes a non-volatile memory module for storing a logic bit in a data program status, a data control circuit electrically connected to the non-volatile memory module for controlling operations of the option fuse circuit, and an output circuit electrically connected to the data control circuit for outputting the logic data bit in a data read status.

17 Claims, 8 Drawing Sheets

| Ports(Nodes) | | Vcp | BIAS | PGM | DIN | RE | ZEN |
|---|---|---|---|---|---|---|---|
| Data program status | PGM state | Vpp | Vpp | Vdd | Vss | Vdd | Vdd |
| | ERASE state | Vpp | Vpp | Vdd | Vdd | Vdd | Vdd |
| Data read status | | Vdd | Vb | Vss | | Vdd/Vss | Vdd/Vss |

PURE CMOS LATCH-TYPE FUSE CIRCUIT

BACKGROUND OF INVENTION

1. Field of the Invention

The invention relates to an option fuse circuit, and more particularly, to an option fuse circuit manufactured with a single-poly CMOS manufacturing process.

2. Description of the Prior Art

Within a variety of electronic products, memories (for example, ROM, DRAM, and SRAM, etc) have always been one of the most important components, as they perform a function of storing volatile and non-volatile data. A memory comprises a plurality of memory cells, each of which is used for storing one bit of digital data. The plurality of memory cells are usually lined up in an array, and manufactured in a form of an integrated circuit using semi-conductor manufacturing processes.

During ordinary semi-conductor manufacturing processes, because it is not possible for a yield of production of integrated circuits to reach 100%, a certain percentage of defective products is expected. Therefore, during the flow from manufacturing to shipping of ICs, a product-testing step is critical and not ignorable. Only through the process of product testing can malfunctioning or unusable products due to the yield issue in a semi-conductor manufacturing process be filtered out and eliminated, guaranteeing that customers are shipped well-functioning products. Through the above description one can see that product testing is extremely important in the semi-conductor manufacturing process.

Since there are a huge number of memory cells in a memory (usually from tens to hundreds of megabytes, for example, 64 Mb or 128 Mb, etc), the probability of a malfunction happening in at least one among these many memory cells is quite high. If there is one malfunctioning memory cell in a memory, the memory will be treated as a defected product and become unusable. This causes trouble for memory manufacturers. Therefore, in general, when designing a memory, beside a main memory cell array an additional set of redundant memory cells is appended, and dedicated circuitry is used for controlling and selecting connections between the set of redundant memory cells and the memory cell array. By utilizing this technique, when some memory cells at certain addresses of the memory cell array are found to malfunction during the product-testing step, the dedicated circuitry can be used for controlling the set of redundant memory cells to replace the function of those malfunctioning memory cells. As a result, it is not necessary to eliminate the memory just because of a small fraction of malfunctioning memory cells, and costs are reduced. The above-mentioned dedicated circuitry is usually called an option fuse circuit.

Figure 1:
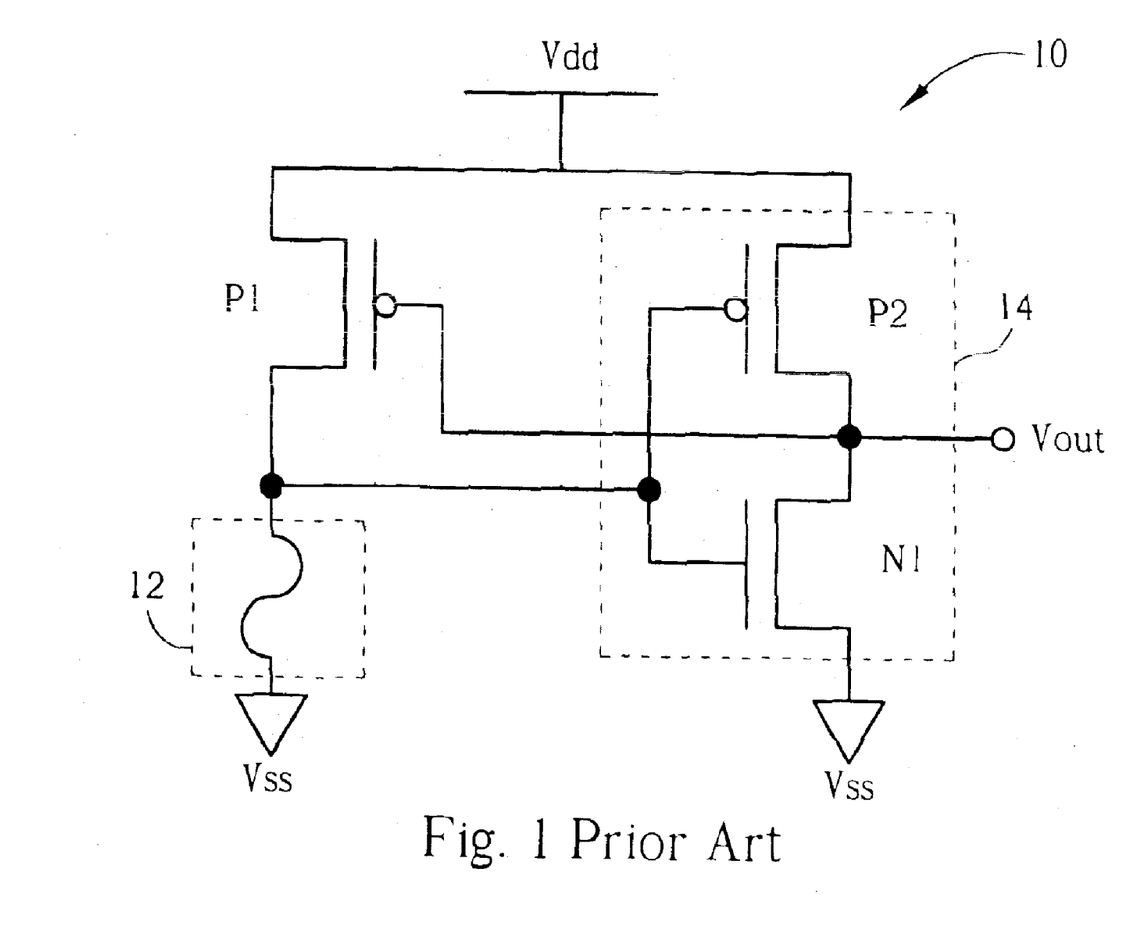
FIG. 1 is a schematic diagram of an embodiment of an option fuse circuit according to the prior art.

Please refer to FIG. 1, which is a schematic diagram of an embodiment of an option fuse circuit 10 according to the prior art. The option fuse circuit 10 comprises a PMOS transistor P1, a PMOS transistor P2, an NMOS transistor N1, and an option fuse 12. The transistors P2, N1 are electrically connected to each other to form an inverter 14, wherein two gates are connected to each other to form an input node of the inverter 14, and two drains are connected to each other to form an output node of the inverter 14. A drain of the transistor P1 and one end of the option fuse 12 are electrically connected to the input node of the inverter 14, a gate of the transistor P1 is electrically connected to the output node of the inverter 14, and the output node of the inverter 14 is pulled out as an output node Vout of the option fuse circuit 10. Finally, sources of the transistors P1, P2 are electrically connected to a system voltage Vdd, and a source of the transistor N1 and the other end of the option fuse 12 are electrically connected to ground Vss.

Figure 2:
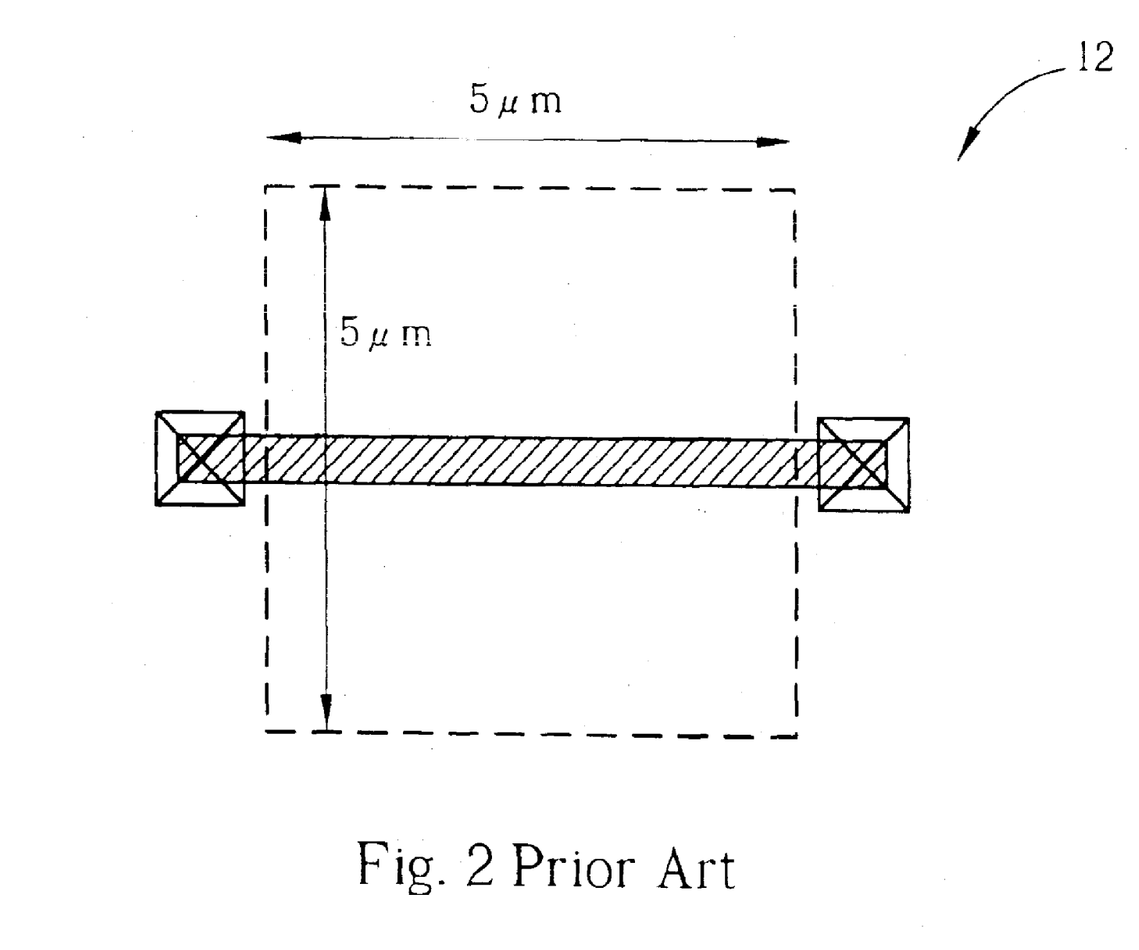
FIG. 2 is a layout diagram of the option fuse shown in FIG. 1.
Figure 3:
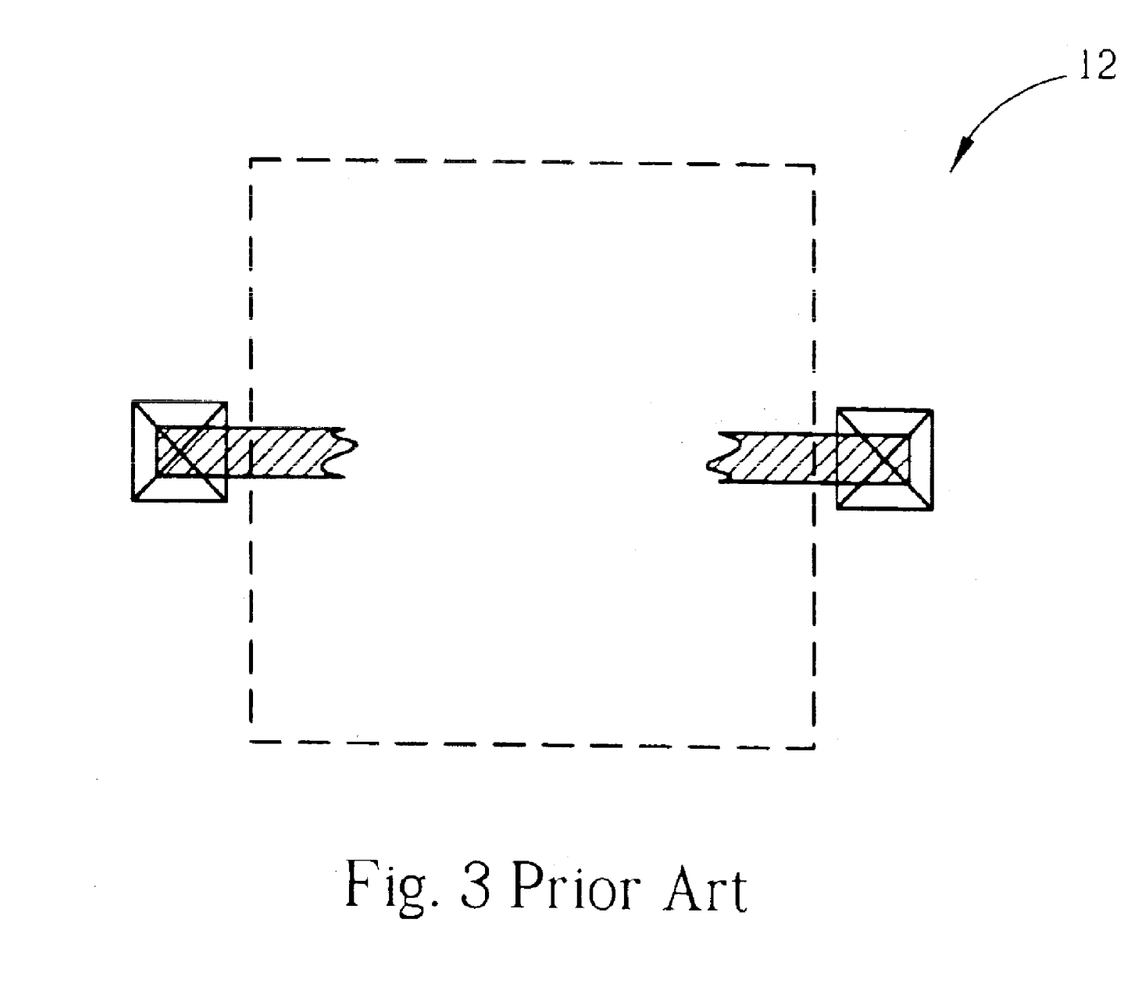
FIG. 3 is a schematic diagram showing that the option fuse shown in FIG. 2 has been cut by a laser.

Please refer to FIG. 1, FIG. 2, and FIG. 3. FIG. 2 shows a layout diagram of the option fuse 12 shown in FIG. 1, and FIG. 3 is a schematic diagram showing that the option fuse 12 shown in FIG. 2 has been cut by a laser. The option fuse 12 is usually laid out using a metal line segment or a poly line segment, and as shown in FIG. 3, during the product-testing process, the option fuse 12 can be cut by the laser according to testing results. Since the output node Vout of the option fuse circuit 10 shows different output signal values between situations of the option fuse 12 being cut and not being cut (Take the option fuse circuit 10 in FIG. 1 for example, when the option fuse 12 is not cut, Vout shows a logical "1", i.e. a high voltage. When the option fuse 12 is cut, Vout shows a logical "0", i.e. a low voltage), values of Vout of a plurality of the option fuse circuits 10 in the memory can be used to encode a combination of the redundant memory cells for replacing the malfunctioned memory cells in the memory array.

Figure 4:
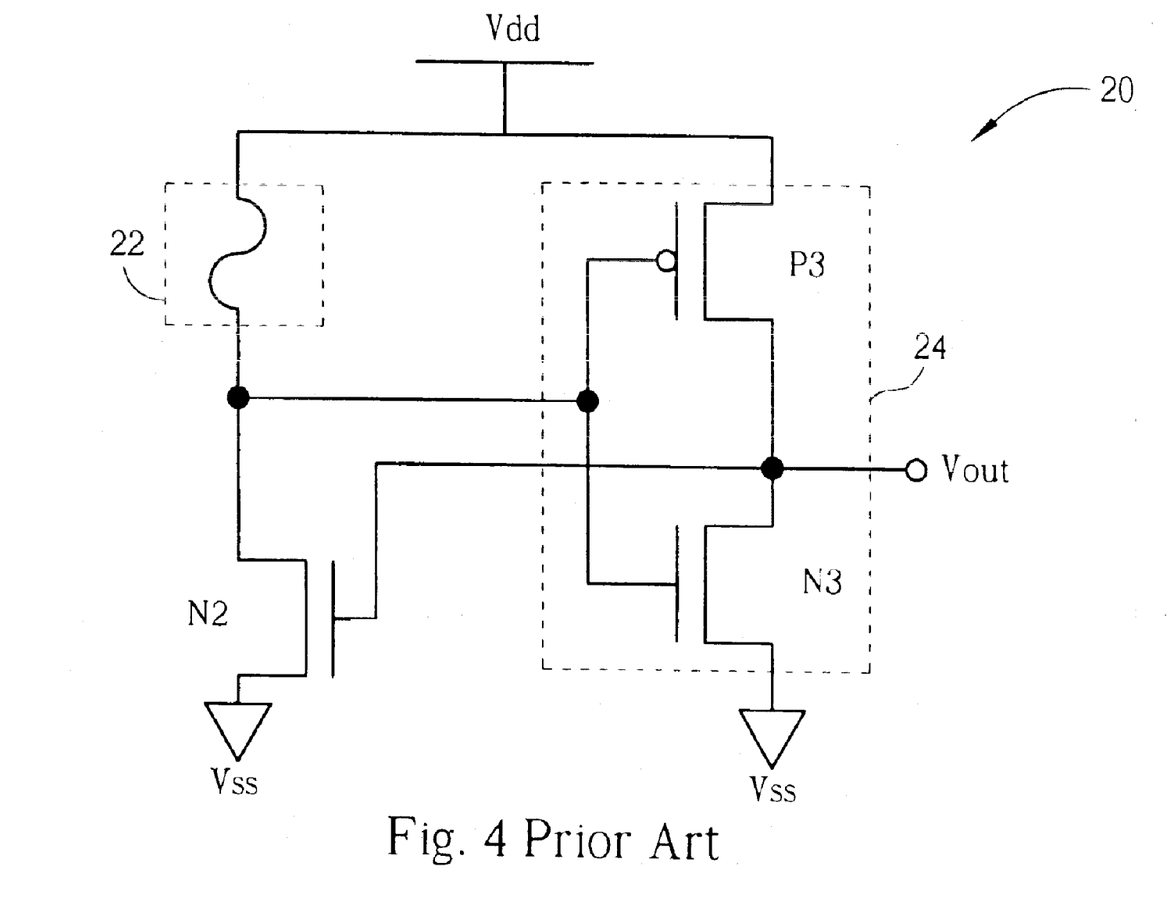
FIG. 4 is a schematic diagram of another embodiment of an option fuse circuit according to the prior art.

Please refer to FIG. 4, which is a schematic diagram of another embodiment of an option fuse circuit 20 according to the prior art. The option fuse circuit 20 comprises a PMOS transistor P3, an NMOS transistor N2, an NMOS transistor N3, and an option fuse 22. The transistors P3, N3 are electrically connected to each other to form an inverter 24. A source of the transistor P3 and one end of the option fuse 22 are electrically connected to a system voltage Vdd, and the transistors N2, N3 are electrically connected to ground Vss. When the option fuse 22 is not cut, Vout shows a logical "0", i.e. a low voltage. When the option fuse 22 is cut, Vout shows a logical "1", i.e. a high voltage. As the above-mentioned embodiment, values of Vout of a plurality of the option fuse circuits 20 in the memory can be used to encode a combination of the redundant memory cells for replacing the malfunctioned memory cells in the memory array.

However, in order to prevent the destruction of surrounding devices due to the laser cutting, it is usually necessary to preserve a sufficient space around the layout of the option fuse 12(22) (as shown in FIG. 2 and FIG. 3, an area of 5 $\mu$m×5 $\mu$m), and in order to proceed the laser cutting, an oxide layer on top of the option fuse 18 needs to be excavated to make an opening. However, the opening gives an entrance for contaminants, such as water vapor, to destroy surrounding devices, and this, as a result, lowers the reliability of these surrounding devices. This phenomenon is most significant when a number of the option fuse circuits 10(20) in the memory dramatically increases following an increasing memory storage space, because more option fuse circuits 10(20) brings a larger number of openings, and hence greater opportunity of contamination of devices in the memory. On the other hand, laser cutting is relatively a much more time-consuming procedure since a large number of option fuses 12(22) are required to be cut one after another during the product-testing process. The above-mentioned effect also causes a significantly long testing time.

As we know, the CMOS manufacturing process is the most popular technique to manufacture semiconductor-related products. Particularly, a single-poly CMOS manufacturing process has the advantages of low cost and easy process. Therefore, the best solution is to apply the single-poly CMOS manufacturing process to achieve a novel design to avoid the above-mentioned problems caused by using laser-cutting technology in an option fuse circuit. In addition, certain technologies according to the prior art adopt flash memories in conjunction with proper circuit designs to realize the option fuse circuit. However, the manufacturing method of flash memories is not compatible with a standard CMOS manufacturing process, and has to include an additional poly-silicon layer to increase the manufacturing costs.

SUMMARY OF INVENTION

It is therefore a primary objective of the claimed invention to provide an option fuse circuit fabricated using single-poly CMOS manufacturing processes and a related method, so as not to require laser cutting technology during testing, to solve the above-mentioned problems.

In the claimed invention, based on the single-poly CMOS manufacturing process, an option fuse circuit without laser cutting technology is proposed. First, due to that the single-poly CMOS manufacturing process is compatible with a standard memory manufacturing process, only one poly-silicon layer is required so that high-cost flash memories can be avoided. Moreover, the option fuse circuit according to the present invention utilizes a non-volatile memory module to store a logic bit so that a function of "data latch" is equipped. Therefore, the option fuse circuit can be treated as a latch-type option fuse circuit to replace the prior-art laser cutting technology.

According to the claimed invention, an option fuse circuit manufactured with a single-poly CMOS manufacturing process is proposed. The option fuse circuit comprises a non-volatile memory module for storing a logic bit in a data program status, a data control circuit electrically connected to the non-volatile memory module for controlling operations of the option fuse circuit, and an output circuit electrically connected to the data control circuit for outputting the logic bit stored in the non-volatile memory module in a data read status.

The claimed invention provides a method for achieving an option fuse circuit based on a single-poly CMOS manufacturing process. The option fuse circuit comprises a single-poly non-volatile memory module, a data control circuit, and an output circuit. The method comprises utilizing the data control circuit to switch the option fuse circuit between a data program status and a data read status, utilizing the data control circuit to store a logic bit to the single-poly non-volatile memory module in the data program status, and utilizing the data control circuit and the output circuit to output the logic bit stored in the single-poly non-volatile memory module in the data read status.

According to the claimed invention, an option fuse circuit manufactured with a single-poly CMOS manufacturing process is proposed. The option fuse circuit comprises: a single-poly non-volatile memory cell for storing a logic bit in a data program status; a data control circuit electrically connected to the non-volatile memory module for switching the option fuse circuit between the data program status and a data read status; two PMOS transistors electrically connected to the data control circuit, wherein sources and drains of the two PMOS transistors are connected to each other; an inverter electrically connected to the two PMOS transistors; and two NMOS transistors electrically connected to the two PMOS transistors and the inverter.

These and other objectives of the present invention will no doubt become obvious to those of ordinary skill in the art after reading the following detailed description of the preferred embodiment, which is illustrated in the various figures and drawings.

DETAILED DESCRIPTION

Figure 5:
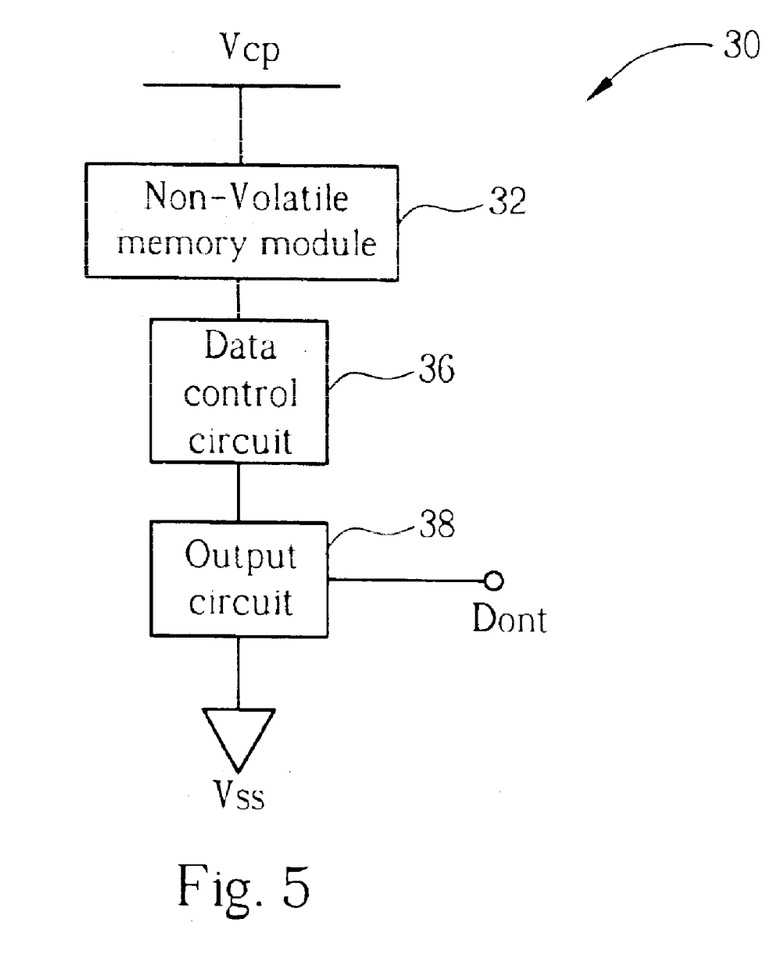
FIG. 5 is a schematic diagram of an embodiment of an option fuse circuit according to the present invention.

Please refer to FIG. 5, which is a schematic diagram of an embodiment of an option fuse circuit 30 according to the present invention. The option fuse circuit 30 is fabricated via a single-poly CMOS manufacturing process with an advantage of low cost for replacing the prior-art laser cutting technology. The option fuse circuit 30 includes a non-volatile memory module 32, a data control circuit 36, and an output circuit 38 included with an output port Dout. The non-volatile memory module 32 can also be fabricated via the single-poly CMOS manufacturing process. The non-volatile memory module 32 can be used to store a logic bit in a data program status, and to coordinate data control circuit 36 and the output circuit 38 to output the logic bit via the output port Dout in a data read status. The non-volatile memory module 32 can be used to latch data so that the option fuse circuit 30 of the present invention can be treated as a latch-type option fuse circuit. The data control circuit 36 is electrically connected to the non-volatile memory module 32 for controlling operations of the option fuse circuit 30 according to voltage levels of a plurality of input ports. The output circuit 38 is electrically connected to the data control circuit 36 for outputting the logic bit stored in the non-volatile memory module 32 in the above-mentioned data read status.

Figure 6:
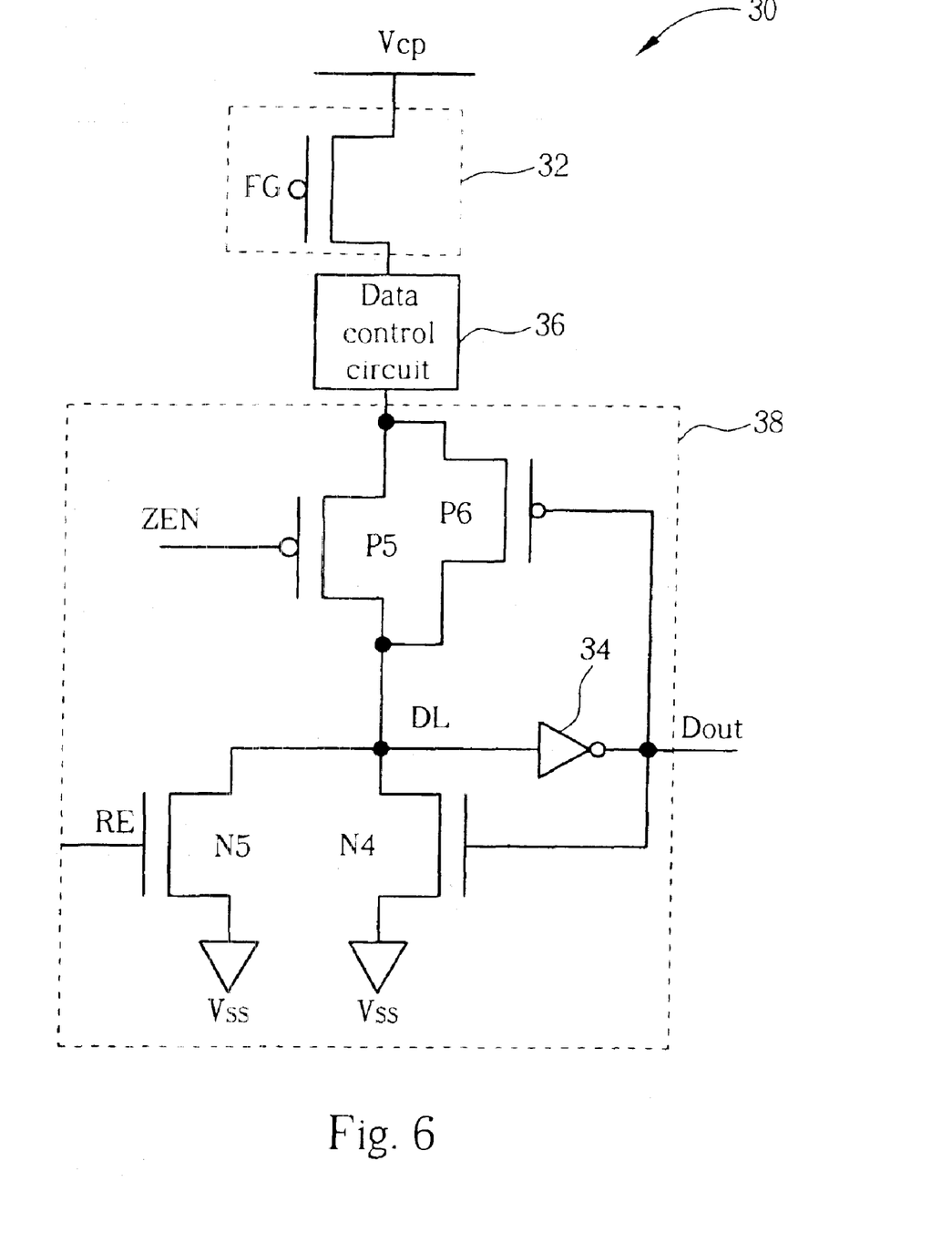
FIG. 6 is a schematic diagram of an embodiment of the option fuse circuit shown in FIG. 5.

Please refer to FIG. 6, which is a schematic diagram of an embodiment of the option fuse circuit 30 shown in FIG. 5. The output circuit 38 is composed of an inverter 34, two PMOS transistors P5, P6, and two NMOS transistors N4, N5. The sources and drains of the two transistors P5, P6 are connected to each other, and the drains of the two transistors N4, N5 are electrically connected to each other. The drains of the two transistors N4, N5 are also connected to the two transistors P5, P6 and the inverter 34. The non-volatile memory module 32 is an embedded OTP memory cell produced by the single-poly CMOS manufacturing process. When being practically implemented, the non-volatile memory module 32 can be a floating-gate (FG) PMOS embedded OTP memory cell or a floating-gate NMOS embedded OTP memory cell. A preferred embodiment for detailing operations of the option fuse circuit 30 shown in FIG. 5 and FIG. 6 is as follows. Please refer to FIG. 7, which is a schematic diagram of a preferred embodiment of the option fuse circuit 50. The option fuse circuit 50 of the present embodiment includes a non-volatile memory module 52(an embedded OTP memory cell 52), three NMOS transistors N6, N7, N8, three PMOS transistors P4, P7, P8, and an inverter 54. The non-volatile memory module 52 can correspond to the non-volatile memory module 32 shown in FIG. 5 and the embedded OTP memory cell 32 shown in FIG. 6. The transistors N6, N7, P7, P8 and the inverter 54 can respectively correspond to the transistors N4, N5, P5, P6 and the inverter 34 shown in FIG. 6.The transistors N6, N7, P7, P8 and the inverter 54 can be integrally viewed as the output circuit 58 of the present embodiment corresponding to the output circuit 38 shown in FIG. 5 and FIG. 6. The transistor P4 and transistor N8 can be treated as the data control circuit 56 of the present embodiment. Designers can make use of controlling voltage levels of a plurality of ports, such as a port VCP (connected to the non-volatile memory module 52), a port PGM, a port DIN, a port BIAS, a port RE, and a port ZEN, to control operations of the option fuse circuit 50.

Figure 7:
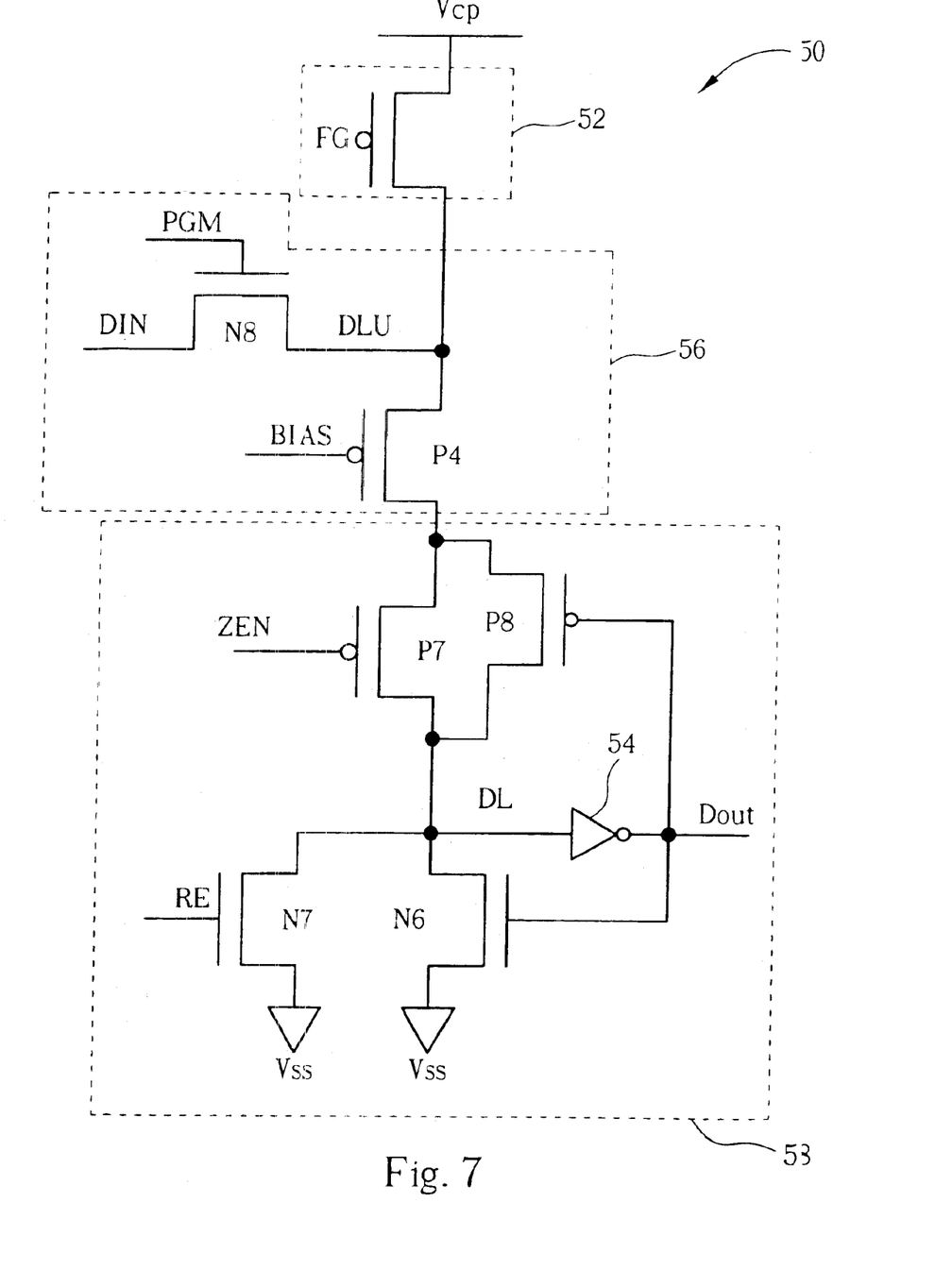
FIG. 7 is a schematic diagram of a preferred embodiment of an option fuse circuit according to the present invention.
Figure 8:
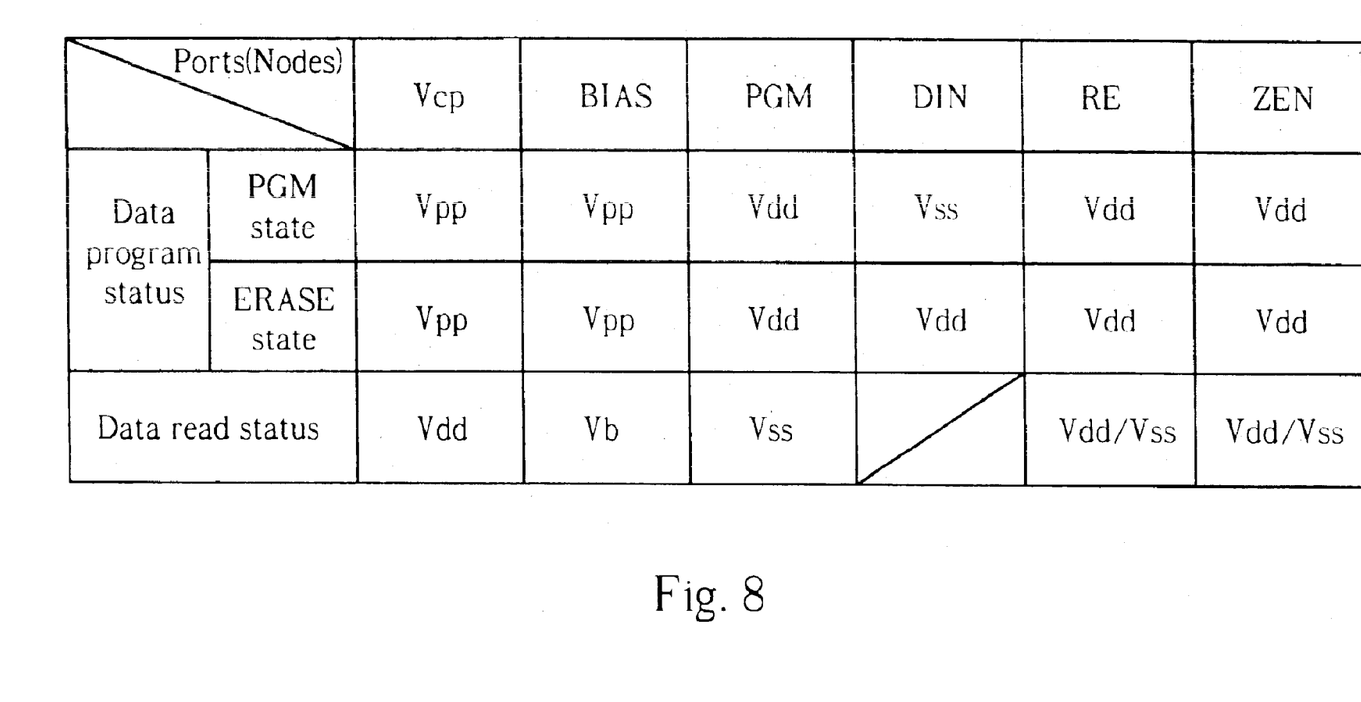
FIG. 8 is a list chart of voltage values of various nodes shown in FIG. 7 in the data program status

Please continue to refer to FIG. 7. During the product-testing process, if certain memory cells in a memory cell array of a memory are found to malfunction, a program procedure of a plurality of option fuse circuits in the memory will be performed so as to select among a plurality of redundant memory cells pre-allocated in the memory to replace the malfunctioned memory cells. Here, one of the option fuse circuits will be taken as an example, and operations of the option fuse circuit in the data program status will be explained utilizing the option fuse circuit 50 shown in FIG. 7. When the option fuse circuit 50 is in the data program status, a determined logic bit (1 or 0) can be stored into the non-volatile memory module 52. Please refer to both FIG. 7 and FIG. 8, which is a list of voltage values of various nodes shown in FIG. 7 in the data program status. In the data program status, voltage value of the port VCP is Vpp, which is slightly higher than a common voltage level Vdd. The port RE is applied with the high voltage level Vdd, and the port BIAS is applied to the voltage level Vpp to turn off the transistor P4. The port PGM is applied to the high voltage level Vdd to turn on the transistor N8. The port ZEN is applied to the high voltage level Vdd to turn off the transistor P7. If the logic bit to be written is 1, the port DIN is applied to the high voltage level Vdd. Therefore, voltage value of the node DLU will be a high voltage level Vpp so that there will be no electrons carried into a floating gate FG of the non-volatile memory module 52. The above-mentioned situation can be called an ERASE state. If the logic bit to be written is 0, the port DIN is applied to the voltage level Vss. Voltage value of the node DLU will be a low voltage level Vss, and there will be lots of electrons carried into the floating gate FG of the non-volatile memory module 52, called PGM state.

After the product-testing process, a memory including the option fuse circuits having undergone the program procedure will be treated as a qualified product, and will be installed into a certain electronic device. When the electronic device using the memory turns on, a read procedure of the option fuse circuits in the memory will be performed so as to correctly select among the redundant memory cells, and to properly replace the malfunctioned memory cells with the selected redundant memory cells. As a result, the memory can function without error. Here, one of the option fuse circuits will be taken as an example, and operations of the option fuse circuit in the data read status will be explained utilizing the option fuse circuit 50 in FIG. 7. In addition, the following descriptions will detail the characteristics of data-latch function to emphasize that the option fuse circuit of the present invention is a latch-type option fuse circuit. Please continue to refer to FIG. 7 and FIG. 8. In the data read status, the logic bit previously stored in the non-volatile memory module 52 will be read out. According to FIG. 8, when the embodiment shown in FIG. 7 is in the data read status, the voltage source VCP is set as Vdd. The port PGM is applied to the (low) voltage level Vss to turn off the transistor N8, and the port BIAS is applied to an ideal voltage value Vb to properly turn on the transistor P4 so that the transistor P4 can be maintained in an ideal status and voltage value of the node DLU can be maintained around an ideal value for fear of any read disturbance when the non-volatile memory module 52 is in the data read status. The port ZEN is applied to the low voltage level Vss to turn on the transistor P7. The port RE is initially set to the high voltage level Vdd. After a period of proper delay time, the port RE is then applied to the low voltage level Vss. If the non-volatile memory module 52 is in the PGM state, voltage value of the node DL will be high, and then voltage value of the output port Dout will be low (equal to the voltage level Vss). Afterwards, the transistor N6 turns off, and the transistor P8 is conducted. Therefore, voltage value of the node DL will be latched in a high voltage level, and voltage value of the output port Dout will be latched in the high voltage level Vss. If the non-volatile memory module 52 is in the ERASE state, voltage value of the node DL is set as a low voltage level, voltage value of the output port Dout is the high voltage level Vdd. The transistor N6 is conducted, and the transistor P8 turns off. Therefore, voltage value of the node DL will be latched in the low voltage level Vss, and voltage value of the output port Dout will be latched in the high voltage level Vdd. Afterwards, the port ZEN will be applied to the high voltage level Vdd to turn off the transistor P7. The above-mentioned embodiment clearly discloses that the option fuse circuit of the present invention is a latch-type option fuse circuit.

In contrast to the prior-art option fuse circuit, the option fuse circuit according to the present invention is a latch-type option fuse circuit, which includes a non-volatile memory module for storing a logic bit in a data program status, a data control circuit, and an output circuit for outputting the logic bit stored in the non-volatile memory module in a data read status. Therefore, significantly long testing times and possible contamination of devices in the memory aroused by the prior-art laser cutting technology can be totally avoided. In addition, the option fuse circuit according to the present invention is fabricated via a single-poly CMOS manufacturing process with advantage of low cost and easy process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An option fuse circuit manufactured with a single-poly CMOS manufacturing process, the option fuse circuit comprising:

a non-volatile memory module for storing a logic bit in a data program status;

a data control circuit electrically connected to the non-volatile memory module for controlling operations of the option fuse circuit; and an output circuit electrically connected to the data control circuit for outputting the logic bit stored in the non-volatile memory module in a data read status;

wherein when the option fuse circuit is in the data program status and the logic bit is equal to a first binary value, the non-volatile memory module is in an ERASE state.

2. The option fuse circuit of claim 1, wherein the output circuit comprises an inverter, two PMOS transistors, and two NMOS transistors.

3. The option fuse circuit of claim 1, wherein when the option fuse circuit is in the data program status and the logic bit is equal to a second binary value that is different from the first binary value the non-volatile memory module is in a PGM state.

4. The option fuse circuit of claim 1, wherein the non-volatile memory module is an embedded OTP memory cell.

5. The option fuse circuit of claim 4, wherein the non-volatile memory module is a floating-gate PMOS embedded OTP memory cell or a floating-gate NMOS embedded OTP memory cell.

6. A method for achieving an option fuse circuit based on a single-poly CMOS manufacturing process, the option fuse circuit comprising a single-poly non-volatile memory module, a data control circuit, and an output circuit, the method comprising:
   utilizing the data control circuit to switch the option fuse circuit between a data program status and a data read status;
   utilizing the data control circuit to store a logic bit to the single-poly non-volatile memory module in the data program status;
   utilizing the data control circuit to switch the single-poly non-volatile memory module into an ERASE state when the option fuse circuit is in the data program status and the logic bit is equal to a first binary value; and
   utilizing the data control circuit and the output circuit to output the logic bit stored in the single-poly non-volatile memory module in the data read status.

7. The method of claim 6 further comprising:
   utilizing the data control circuit to switch the single-poly non-volatile memory module into a PGM state when the option fuse circuit is in the data program status and the logic bit is equal to a second binary value that is different from the first binary value.

8. The method of claim 6, wherein the single-poly non-volatile memory module is a floating-gaze PMOS embedded OTP memory cell or a floating-gate NMOS embedded OTP memory cell.

9. The method of claim 6, wherein the output circuit comprises an inverter, two PMOS transistors, and two NMOS transistors.

10. An option fuse circuit manufactured with a single-poly CMOS manufacturing process, the option fuse circuit comprising:
    a single-poly non-volatile memory cell for storing a logic bit in a data program status;
    a data control circuit electrically connected to the non-volatile memory module for switching the option fuse circuit between the data program status and a data read status;
    two PMOS transistors electrically connected to the data control circuit, wherein sources and drains of the two PMOS are connected to each other;
    an inverter electrically connected to the two PMOS transistors; and two NMOS transistors electrically connected to the two PMOS transistors and the inverter;
    wherein when the option fuse circuit is in the data program status and the logic bit is equal to a first binary value, the single-poly non-volatile memory module is in an ERASE state.

11. The option fuse circuit of claim 10, wherein when the option fuse circuit is in the data read status and the single-poly non-volatile memory module is in the ERASE state, the option fuse circuit outputs an output signal of a high voltage level.

12. The option fuse circuit of claim 10, wherein when the option fuse circuit is in the data program status and the logic bit is equal to a second binary value that is different from the first binary value, the non-volatile memory module is in a PGM state.

13. The option fuse circuit of claim 12, wherein when the option fuse circuit is in the data read status and the single-poly non-volatile memory module is in the PGM state, the option fuse circuit outputs an output signal of a low voltage level.

14. The option fuse circuit of claim 10, wherein the single-poly non-volatile memory cell is a floating-gate PMOS embedded OTP memory cell or a floating-gate NMOS embedded OTP memory cell.

15. The option fuse circuit of claim 3, wherein the first binary value is equal to 1 and the second binary value is equal to 0.

16. The method of claim 7, wherein the first binary value is equal to 1 and the second binary value is equal to 0.

17. The option fuse circuit of claim 12, wherein the first binary value is equal to 1 and the second binary value is equal to 0.

* * * * *